United States Patent [19]
Dufossez

[11] Patent Number: 5,952,889
[45] Date of Patent: Sep. 14, 1999

[54] PHASE-LOCKED LOOP WITH A LOCKING AID CIRCUIT

[75] Inventor: Vincent Dufossez, Grenoble, France

[73] Assignee: SGS-Thomson Microelectronics S.A., Saint Genis, France

[21] Appl. No.: 09/047,103

[22] Filed: Mar. 24, 1998

[30] Foreign Application Priority Data

Mar. 25, 1997 [FR] France .................................. 97 03907

[51] Int. Cl.⁶ .............................. H03L 7/10; H03K 3/033
[52] U.S. Cl. ........................ 331/11; 331/25; 327/227; 327/230
[58] Field of Search .................... 331/10, 11, 2, 331/25; 327/227, 230

[56] References Cited

U.S. PATENT DOCUMENTS

| | | | |
|---|---|---|---|
| 4,580,107 | 4/1986 | Caldwell et al. | 331/11 |
| 4,717,891 | 1/1988 | Ichise et al. | 331/8 |
| 4,952,850 | 8/1990 | Ogino et al. | 315/387 |

OTHER PUBLICATIONS

Patent Abstracts of Japan, vol. 002, No. 102 (E–052), Aug. 23, 1978 & JP–A–53 068553 (Mitsubishi Electric Corp.).
Patent Abstracts of Japan, vol. 007, No. 251 (E–209), Nov. 8, 1983 & JP–A–58 137308 (Nippon Denki KK).
Hallmark J., et al., "FM PLL Demodulator With Loop Bandwidth Controlled By Transistor Matching" Motorola Technical Developments, vol. 8, No. 1, Oct. 1988, pp. 67–69.

Primary Examiner—Siegfried H. Grimm
Attorney, Agent, or Firm—Wolf, Greenfield & Sacks, P.C.

[57] ABSTRACT

A phase-locked loop of the type including a locking aid circuit providing a d.c. presetting signal representative of the carrier frequency of an input signal to set the quiescent frequency of a controlled oscillator of the phase-locked lop. The locking aid circuit includes a monostable latch clocked by the input signal to provide pulses of predetermined width, the presetting signal corresponding to the mean value of these pulses.

36 Claims, 4 Drawing Sheets

PHASE-LOCKED LOOP WITH A LOCKING AID CIRCUIT

BACKGROUND OF THE INVENTION

1. Field of the Invention

The present invention relates to a phase-locked loop used in a frequency demodulator, and more specifically to such a loop designed to lock on a carrier frequency which can vary within a wide range.

2. Discussion of the Related Art

FIG. 1 schematically shows a conventional phase-locked loop capable of locking on a carrier frequency that varies within a wide range. This phase-locked loop includes a main phase-locked loop 10 and a locking aid circuit 12 which is conventionally formed of an auxiliary phase-locked loop.

Main phase-locked loop 10 includes a multiplier 14 receiving input signal Fin and the output of a (voltage or current) controlled oscillator 16. The output of multiplier 14 controls oscillator 16 via a low-pass filter 18 for eliminating the carrier frequency and passing the modulated frequencies. The output of filter 18 forms the demodulated signal Id.

Locking aid circuit 12 provides a d.c. presetting signal I0 that an adder 19 superposes to demodulated signal Id to set the quiescent frequency of oscillator 16 to the carrier frequency of signal Fin.

The auxiliary phase-locked loop of aid circuit 12 includes a multiplier 20 receiving input signal Fin and the output of a (current or voltage) controlled oscillator 22. The output of multiplier 20 is provided to the control input of oscillator 22 via a low-pass filter 24, the pass-band of which, much higher than that of filter 18, is adapted to the variation range of the carrier frequency of signal Fin.

The output of filter 24 forms signal I0 for presetting the quiescent frequency of oscillator 16 after a new filtering by a low-pass filter 26. The pass-band of filter 26 is such that signal I0 is a d.c. signal and corresponds to the mean value of the output signal of filter 24. In any case, the pass-band of filter 26 is lower than the lowest frequency of demodulated signal Id.

FIG. 2 schematically shows a conventional current-controlled oscillator, which can be used for oscillators 16 and 22. This oscillator includes a capacitor C, a terminal of which is connected to a fixed potential, such as ground GND. The other terminal of capacitor C is connected to the input of a Schmitt trigger or hysteresis comparator 30, to a charge current source 32 by a switch K1, and to a discharge current source 33 by a switch K2. Current sources 32 and 33 are further connected, respectively, to a high supply potential Vcc and to ground GND.

The output Vs of hysteresis comparator 30 directly controls switch K2 and controls switch K1 via an inverter 35.

The current of sources 32 and 33 is determined by a current Iin. Actually, sources 32 and 33 are formed of output branches of current mirrors, the input branches of which receive current Iin.

In operation, when output Vs is at zero, switch K1 is closed and capacitor C charges through source 32. When the high threshold of hysteresis comparator 30 is reached, output Vs switches. Then, switch K1 opens while switch K2 closes, causing the discharge of capacitor C through source 33. If the current of sources 32 and 33 varies, the charge and discharge times of the capacitor, and therefore the frequency of output signal Vs, also vary.

In the circuit of FIG. 1, presetting signal I0 is the d.c. component of the control signal of oscillator 22, and thus is the value which sets the quiescent frequency of oscillator 22 to the carrier frequency of signal Fin. In principle, if oscillators 16 and 22 are coupled and operate in the same conditions, signal I0 also sets the quiescent frequency of oscillator 16 to the carrier frequency of signal Fin.

The coupling is not difficult to obtain in integrated technology. However, oscillator 22 will never operate in the same conditions as oscillator 16. Indeed, the control signal of oscillator 22 exhibits significant frequency variations, due to the high pass-band of filter 24, while the control signal of oscillator 16 varies slowly. As a result, presetting signal I0 is not exactly the signal which should be applied to oscillator 16 to set its quiescent frequency to the carrier frequency of signal Fin.

This error of presetting signal I0 can cause losses of locking of loop 10, which causes a risk of capturing wrong frequencies in the qFin form present in the pass-band of filter 24 (q being a quotient of two integers).

Further, phase-locked loop 10 attempts to compensate this error of signal I0 by generating a d.c. component which superposes to output signal Id. This d.c. component must generally be suppressed downstream and decreases the dynamic range of the output signal.

SUMMARY OF THE INVENTION

An object of the present invention is to provide a phase-locked loop including a locking aid circuit that provides a particularly accurate presetting signal.

This and other objects are achieved by means of a phase-locked loop of the type including a locking aid circuit that provides a d.c. presetting signal representative of the carrier frequency of an input signal to set the quiescent frequency of a controlled oscillator of the phase-locked loop. The locking aid circuit includes a monostable latch clocked by the input signal to provide pulses of predetermined width, the presetting signal corresponding to the mean value of these pulses.

According to an embodiment of the present invention, the phase-locked loop includes means for setting the amplitude of the pulses proportionally to the presetting signal and for setting the width of the pulses in inverse proportion to the presetting signal.

According to an embodiment of the present invention, the phase-locked loop includes first and second current mirrors, a first output branch of the first mirror being coupled to the input branch of the second mirror by a switch controlled by the output signal of the monostable latch, an output branch of the second mirror being coupled to the input branch of the first mirror by a low-pass filter, and second and third output branches of the first mirror respectively providing the presetting signal of the controlled oscillator and a pulse width presetting signal to the monostable latch.

According to an embodiment of the present invention, the copying ratios of the first and third output branches of the first mirror are higher than that of the second output branch.

According to an embodiment of the present invention, the monostable latch has substantially the same structure as the controlled oscillator.

According to an embodiment of the present invention, the monostable latch includes a capacitor coupled with charge and discharge current sources by respective switches; a hysteresis comparator receiving the voltage across the capacitor; a gate for controlling one of the respective switches when the input signal of the phase-locked loop and the output signal of the comparator are both in the high state;

a gate for controlling the other one of the respective switches when the input signal of the phase-locked loop and the output signal of the comparator are both in the low state; and a gate for providing the output pulses of the monostable latch when the input signal of the phase-locked loop and the output signal of the comparator are both in a same state.

According to an embodiment of the present invention, the phase-locked loop includes four latches connected to generate, from the input signal of the phase-locked loop and the output signal of the comparator, four signals which are never all four at the same state when the frequency of the output signal of the comparator differs from that of the input signal of the phase-locked loop, and which all four take the same state when the frequency of the output signal of the comparator is equal to that of the input signal of the phase-locked loop, means being provided to force to an active state the output of the monostable latch when the state of one at least of the four signals differs from the others.

The foregoing objects, features and advantages of the present invention, will be discussed in detail in the following non-limiting description of specific embodiments in connection with the accompanying drawings.

DETAILED DESCRIPTION

Figure 1:
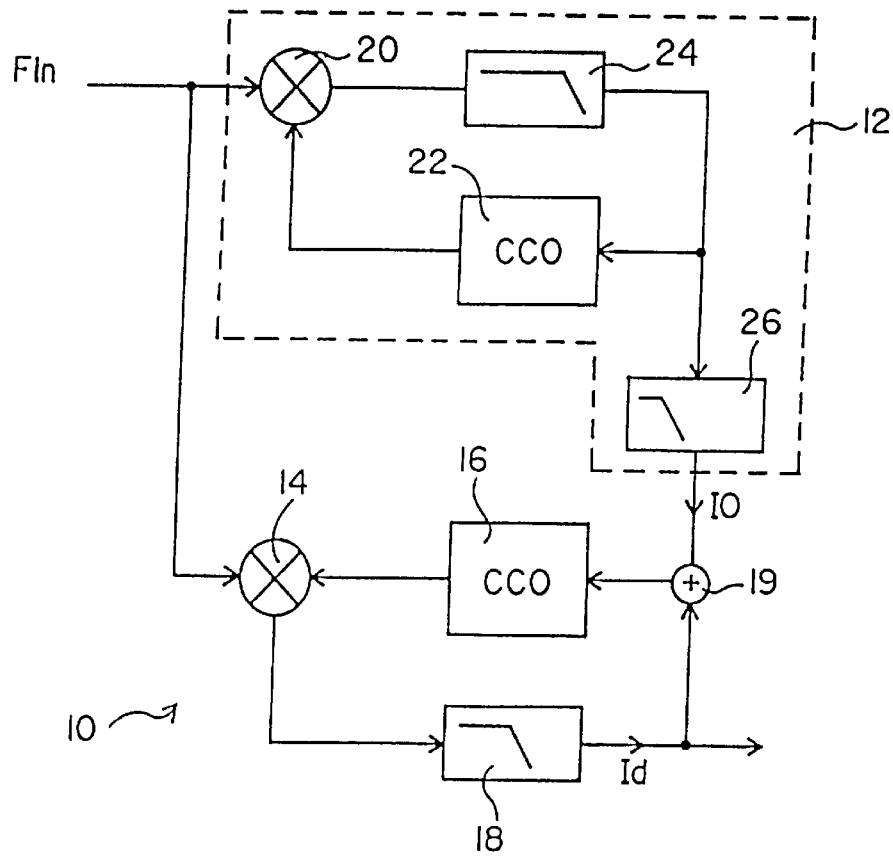
FIG. 1, previously described, shows a phase-locked loop including a conventional locking aid circuit.
Figure 3:
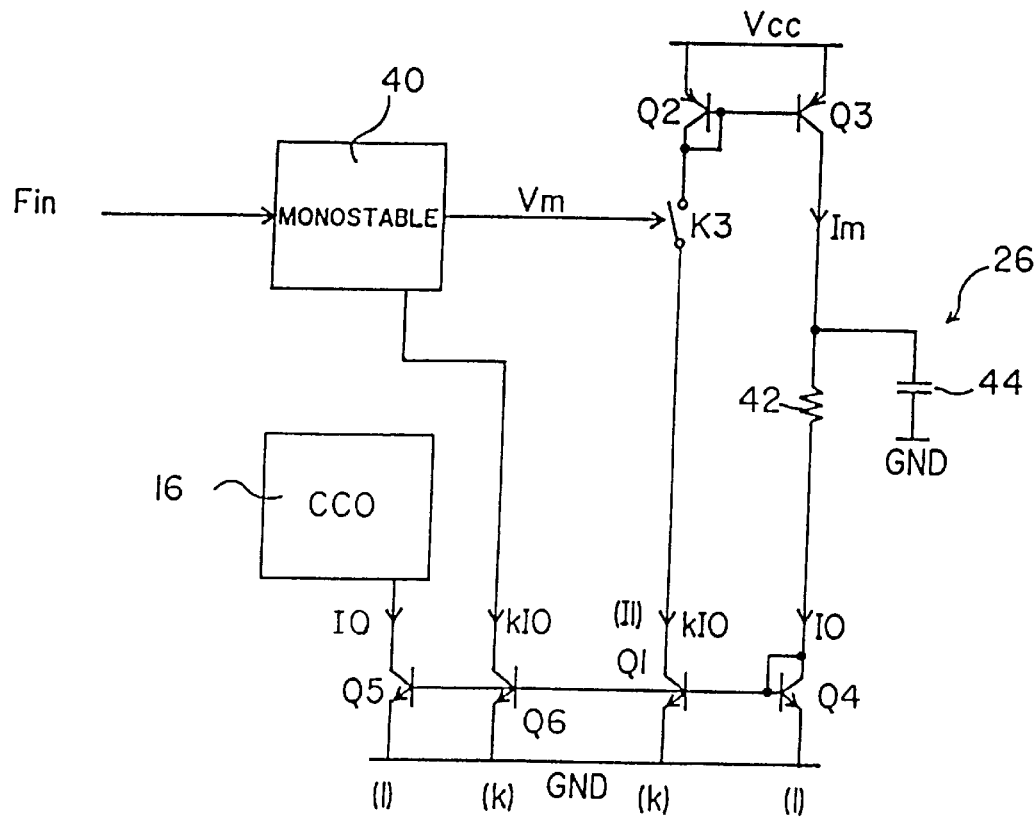
FIG. 3 shows an embodiment of locking aid circuit according to the present invention.

In FIG. 3, conventional locking aid circuit 12 of FIG. 1 is replaced, according to the present invention, with a locking aid circuit based on a monostable latch 40 clocked by input signal Fin of the phase-locked loop. Logic output signal Vm of monostable latch 40 is converted into a current Im, the mean value of which, obtained by filter 26 already present in the conventional circuit of FIG. 1, forms the presetting current I0 of current-controlled oscillator 16.

More specifically, the logic signal Vm generated by monostable latch 40 controls a switch K3 placed between a current source Q1 connected to ground GND and the input branch of a current mirror formed of two PNP transistors Q2 and Q3. Current source Q1 is formed of an NPN transistor, the emitter of which is connected to ground GND and the collector of which is connected to switch K3. The bases of transistors Q2 and Q3 are connected to each other and their emitters are connected to high supply potential Vcc. The collector of transistor Q3 provides current Im. The collector and the base of transistor Q2 are connected to switch K3.

Figure 4:
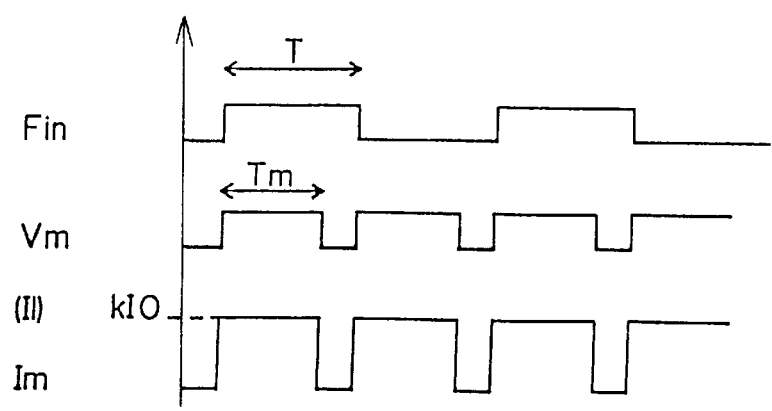
FIG. 4 illustrates signals present in the circuit of FIG. 3.

The collector of transistor Q3 is connected, by a resistor 42, to the base and to the collector of an NPN transistor Q4, the emitter of which is connected to ground GND. Transistor Q4 forms the input branch of a current mirror. An output branch of this mirror is formed of an NPN transistor Q5, the base of which is connected to that of transistor Q4 and the emitter of which is connected to ground GND. The collector of transistor Q5 issues presetting current I0 to oscillator 16. A capacitor 44 is further connected between the collector of transistor Q3 and ground GND. Resistor 42 and capacitor 44 form low-pass filter 26. In a simplified embodiment of the locking aid circuit according to the present invention, the width Tm of the pulses provided by monostable latch 40 is assumed to be constant and current source Q1 is assumed to be independent from current mirror Q4–Q5, that is, the collector current of transistor Q1, which will be referred to as I1 for the moment, is independent from current I0. FIG. 4 illustrates input signal Fin, the corresponding output signal Vm of monostable latch 40, and current Im. Signal Fin has a half-period T. At each edge of signal Fin, signal Vm exhibits a pulse of width Tm, lower than half-period T. Current Im has the same outlook as signal Vm, except that it varies between zero and current I1 provided by the collector of transistor Q1. Current I0 is equal to the mean value of current Im, and is written as:

$$I0 = I1\frac{Tm}{T}.$$

The half-period of the signal issued by oscillator 16 is:

$$T_{16} = \frac{C_{16}\Delta V_{16}}{I0}$$

or yet, replacing I0 with its value, $$T_{16} = \frac{C_{16}\Delta V_{16}}{I1 \cdot Tm}T,$$

where $C_{16}$ and $\Delta V_{16}$ are respective values of capacitor C and of the hysteresis of comparator 30 of oscillator 16.

Thus, for the quiescent frequency of oscillator 16 to be equal to the carrier frequency of signal Fin, one must have $T_{16}=T$, that is, the various parameters of the circuit must be set to obtain $C_{16}\Delta V_{16}=I1.Tm$.

The still undescribed elements of FIG. 3 allow automatic parameter setting to obtain $T=T_{16}$.

More specifically, transistor Q1 forms a second output branch of mirror Q4–Q5, that is, the base of transistor Q1 is connected to the base of transistor Q4. Further, the pulse width Tm of monostable latch 40 is set by a third output branch of mirror Q4–Q5. This third branch is formed of an NPN transistor Q6, the base of which is connected to the bases of transistors Q1, Q4, and Q5, the emitter of which is connected to ground GND, and the collector of which is connected to a pulse width setting input of monostable latch 40.

The standardized emitter surfaces of transistors Q1, Q4, Q5, and Q6 are indicated between parenthesis under the transistors. The standardized surfaces of transistors Q4 and Q5 are equal to 1, while the standardized surfaces of transistors Q1 and Q6 are equal to k, where k is a factor higher than 1. Thus, the collector currents of transistors Q4 and Q5 are equal to I0, while the collector currents of transistors Q1 and Q6 are equal to kI0.

With this configuration, as indicated in FIG. 4, current Im exhibits pulses of width Tm and of amplitude kI0. Presetting current I0, equal to the mean value of current Im, then is:

$$I0 = kI0 \frac{Tm}{T},$$

which means that the system must tend to a stable state where pulsewidth Tm is such that T=kTm.

This pulsewidth, provided by monostable latch 40 now controlled by current kI0, is expressed as:

$$Tm = \frac{C_{40} \Delta V_{40}}{kI0},$$

where $C_{40}\Delta V_{40}$ is a constant of monostable latch 40.

It is for example assumed that half-period T increases. If pulsewidth Tm does not vary immediately, the cyclic ratio of current Im, and thus the value of current I0, decrease. As current I0 decreases, control current kI0 of monostable latch 40 also decreases, causing the increase of pulsewidth Tm and thus of the cyclic ratio. This, until balance T=kTm is obtained again.

It can be noticed that the system reacts so that the amplitude of pulses Im is maintained (the width varies in inverse proportion to the amplitude).

By combining the last two expressions, one obtains:

$$I0 = \frac{C_{40} \Delta V_{40}}{T}.$$

Using the value in the expression of period $T_{16}$ of oscillator 16, which remains unchanged according to I0, one obtains:

$$T_{16} = \frac{C_{16} \Delta V_{16}}{C_{40} \Delta V_{40}} T.$$

To obtain $T_{16}$=T, it is enough to make the structures of monostable latch 40 and of oscillator 16 similar so that they have the same constants $C_{16}$=$C_{40}$ and $\Delta V_{16}$=$\Delta V_{4}0$.

Figure 2:
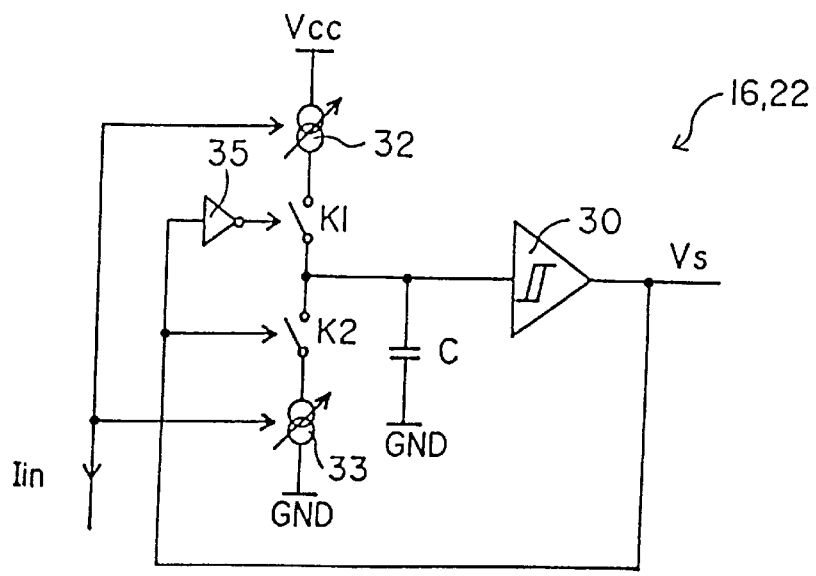
FIG. 2 shows a conventional current-controlled oscillator usable in the circuit of FIG. 1.
Figure 5:
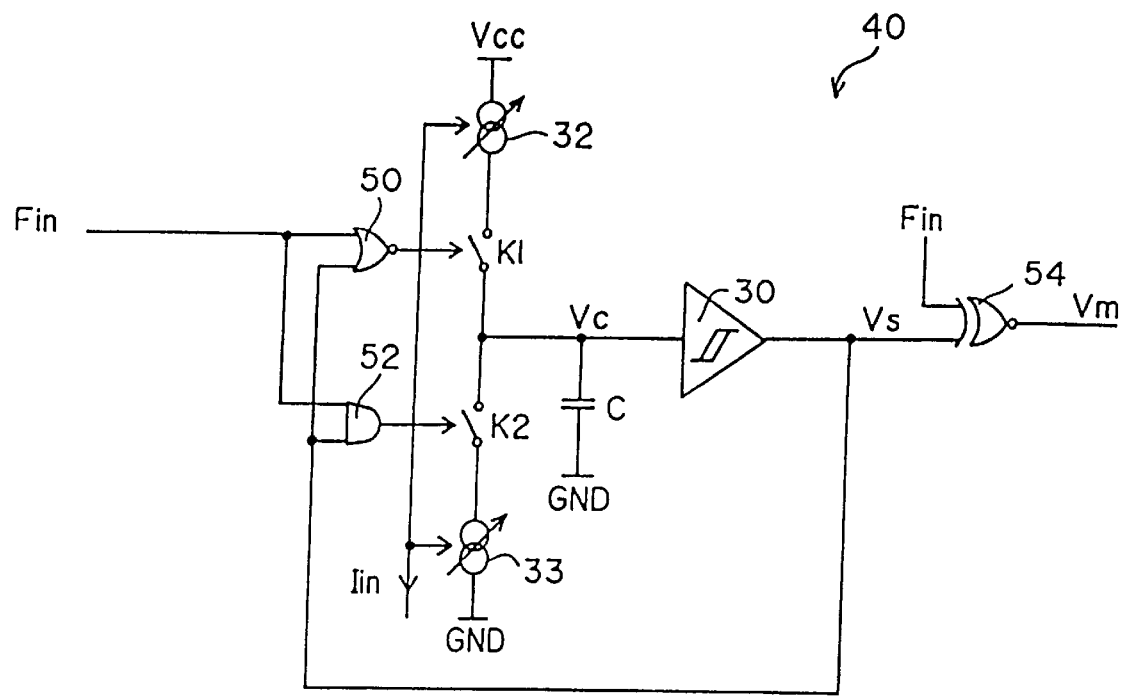
FIG. 5 shows an embodiment of monostable latch used in the circuit of FIG. 3 and implemented from a conventional controlled oscillator.

FIG. 5 schematically shows a monostable latch obtained, according to the present invention, from the oscillator in FIG. 2. The same elements in FIG. 2 and 5 are referred to with the same references. The circuit of FIG. 5 differs from that in FIG. 2 by the control of switches K1 and K2 and by a processing of the output Vs of hysteresis comparator 30.

Charging switch K1 of capacitor C is closed when signals Fin and Vs are both in a first logic state, for example, 0, while discharging switch K2 of capacitor C is closed when signals Fin and Vs are both in a second state, for example, 1. As shown as an example, switch K1 is controlled by a NOR gate 50 receiving signals Fin and Vs, while switch K2 is controlled by an AND gate 52 receiving signals Fin and Vs.

Logic output signal Vm of the monostable latch is provided by an XOR gate 54 receiving signal Vs and signal Fin.

All the essential elements of this circuit can easily be coupled with the corresponding elements of oscillator 16, especially capacitor C and hysteresis comparator 30, as well as the other elements which could control the time constants, such as current sources 32, 33, and switches K1, K2.

The choice of factor k matters little, provided that it is higher than one but close enough to one for monostable latch 40 and oscillator 16 to operate in the same conditions.

Indeed, factor k determines the difference of charge and discharge slope between the capacitor C of the monostable latch and the capacitor C of the oscillator. A factor k of approximately 1.15 provides satisfactory results.

Figure 6:
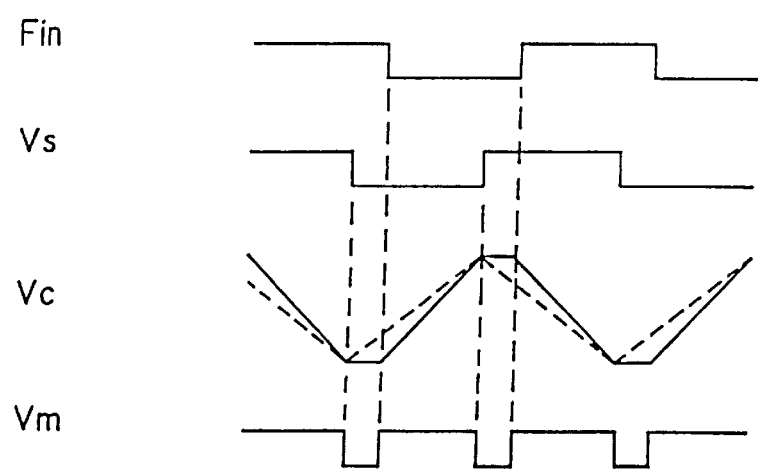
FIG. 6 illustrates signals present in the circuit of FIG. 5 during an operation in normal conditions.

FIG. 6 shows an example of several signals to illustrate the operation of the circuit of FIG. 5. FIG. 6 shows in particular input signal Fin of the phase-locked loop, signal Vs at the output of hysteresis comparator 30, a signal Vc representing the voltage variations across capacitor C, and signal Vm at the output of XOR gate 54 and corresponding to the output signal of the monostable latch.

Signal Fin has a cyclic ratio of 50%. Initially, signal Fin and signal Vs are at 1, whereby switch K2 is closed and signal Vm is at 1. Capacitor C discharges to the low threshold of hysteresis comparator 30. When this threshold is reached, signal Vs switches to 0 while signal Fin still is at 1. Switch K2 is opened and the charge of capacitor C remains constant, since switch K1 is also opened. Signal Vm switches to 0.

When signal Fin switches to 0, signal Vs still is at 0, which causes the closing of switch K1 and the switching of signal Vm to the high state. Capacitor C charges to the high threshold of hysteresis comparator 30, where signal Vs switches back to 1 while signal Fin still is at 0. Switches K1 and K2 are both open, the charge of capacitor C remains constant, and signal Vm switches to 0.

When signal Fin switches back to 1, the initial conditions are found again.

The voltage across capacitor C of oscillator 16 operating in the same conditions has been shown in superposition on signal Vc. This voltage is triangular, the peaks corresponding to the edges of signal Vs provided by the oscillator.

Of course, the signal generated by oscillator 16 and that generated by monostable latch 40 are not necessarily in phase, but they have the same frequency.

For slow variations of the frequency of signal Fin, the circuit of FIG. 3 adjusts automatically so that the cyclic ratio of signal Vm is always equal to 1/k (T=kTm). However, upon an abrupt variation of the frequency of signal Fin, for example upon power-on, there can occur a transient phase where current kI0 is too low for the voltage across capacitor C to switch from one threshold of hysteresis comparator 30 to the other in a half-period of signal Fin.

Figure 7:
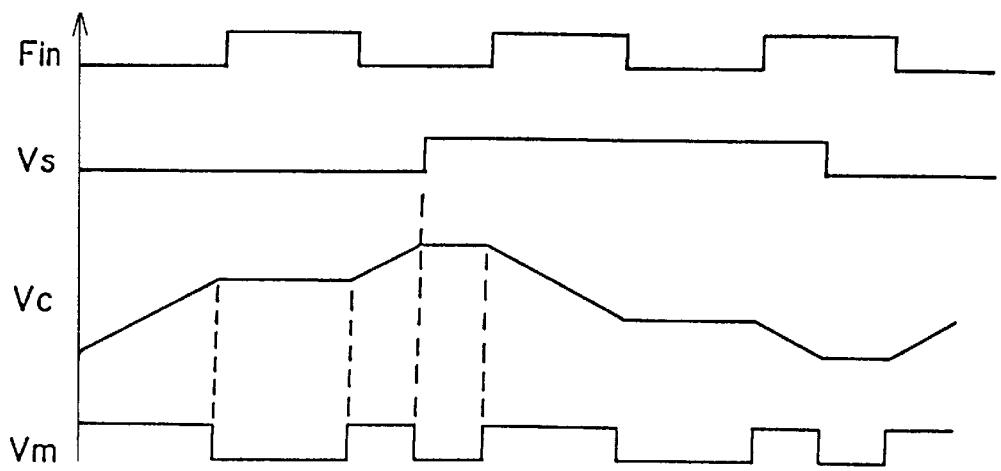
FIG. 7 illustrates signals present in the circuit of FIG. 5 in extreme operating conditions.

FIG. 7 illustrates the same signals as FIG. 6 in this case.

Initially, signals Fin and Vs are at 0. Capacitor C charges but does not reach the high threshold of hysteresis comparator 30 at the time when signal Fin switches to 1. As a result, however, switch K1 is opened and capacitor C stops charging. Signal Vs does not switch. When signal Fin switches back to 0, signal Vs is still at 0, which causes a new charging of capacitor C. This time, capacitor C charges to the high threshold of the comparator, where signal Vs switches to 1 while signal Fin still is at 0. The capacitor stops charging. When signal Fin switches back to 1, signal Vs still is at 1, which causes a discharge of capacitor C. However, when signal Fin switches back to 0, capacitor C will not have had the time to discharge to the low threshold of the comparator. The capacitor stops discharging while signal Vs remains at 1. The capacitor starts discharging again at the time when signal Fin switches to 1 while signal Vs still is at 1. The capacitor discharges to the low threshold of the comparator before the next falling edge of signal Fin. Signal Vs then switches to 0 and the discharge of the capacitor stops. At the next falling edge of signal Fin, the preceding cycle is repeated.

As is shown, signal Vm has any outlook which is not the desired signal continuously on 1. It is desired, in this case, that signal Vm is continuously on 1 to cause the permanent closing of switch K3. Indeed, current mirrors Q2–Q3 and Q4–Q1 then form a positive reaction amplifier since factor k is higher than one. Current I0 thus increases until the charge and discharge rate of the capacitor of monostable latch 40 is sufficient for one or the other of the thresholds of the hysteresis comparator to be reached within one half-period of signal Fin. At this time, the increase of current I0 is stopped by the opening of switch K3.

Figure 8:
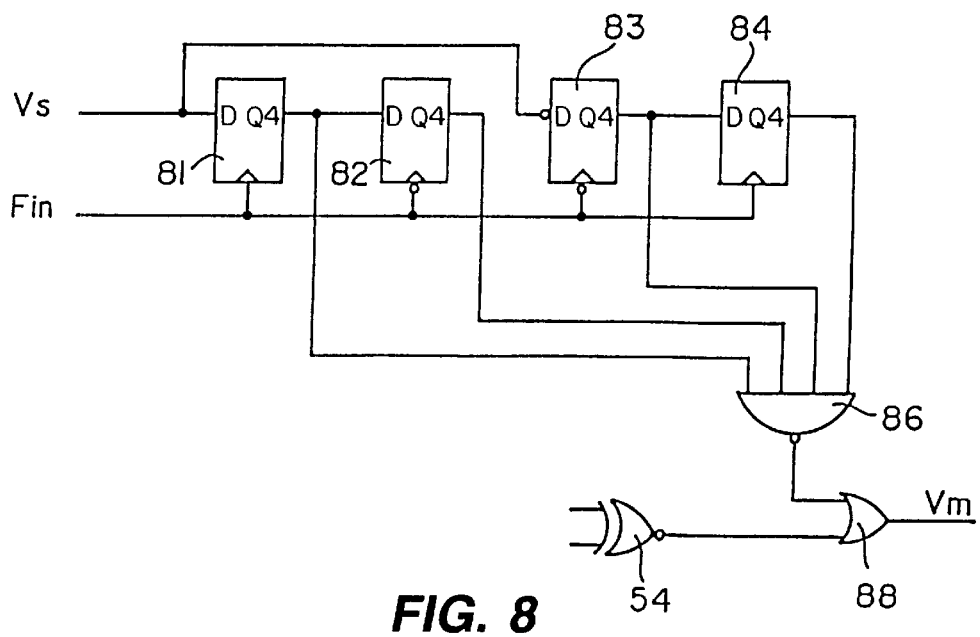
FIG. 8 shows an example of circuit which can be used to suppress the malfunctions caused by the operation in the extreme case of FIG. 7.

FIG. 8 shows an example of a circuit that forces to 1 the output Vm of monostable latch 40 when current I0 is insufficient for capacitor C to charge or discharge within one half-period of signal Fin. This circuit includes four D-type flip-flops designated by references 81 to 84. Flip-flops 81 and 84 are clocked by signal Fin, while flip-flops 82 and 83 are clocked by the inverse of signal Fin. Flip-flops 81 and 83 respectively receive on their data inputs D signal Vs and inverted signal Vs. The input of flip-flop 82 receives the output Q1 of flip-flop 81 and the input of flip-flop 84 receives the output Q3 of flip-flop 83. Outputs Q1 to Q4 of the flip-flops are supplied to a NAND gate 86. An OR gate 88 receives the output of XOR gate 54 of FIG. 5 and the output of gate 86 to issue output signal Vm of the monostable latch.

Figure 9:
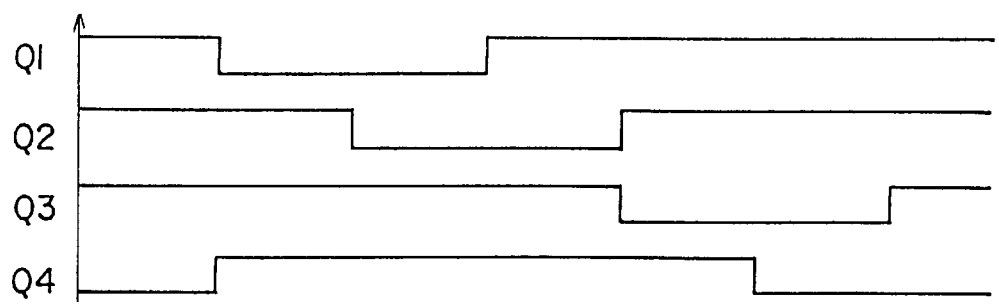
FIG. 9 illustrates signals present in the circuit of FIG. 8 during an operation in the extreme case of FIG. 7.

FIG. 9 illustrates output signals Q1 to Q4 of the flip-flops in the case of the extreme operation of FIG. 7. Signal Q1 takes the state of signal Vs upon each rising edge of signal Fin. Signal Q3 takes the inverse of the state of signal Vs upon each falling edge of signal Fin. Signal Q2 takes the state of signal Q1 upon each falling edge of signal Fin. Finally, signal Q4 takes the state of signal Q3 upon each rising edge of signal Fin.

It can be noticed that, in the case of the extreme operation of FIG. 7, at least one of signals Q1 to Q4 always has a value different from the three other signals. In this case, the output of gate 86 is always at 1 and forces to 1 signal Vm of output of the monostable latch.

In a case of normal operation, signals Q1 to Q4 are all at 1 from the beginning of the second period of signal Fin. The output of gate 86 then switches to zero, whereby signal Vm is equal to the output signal of XOR gate 54.

Of course, the present invention is likely to have various alterations, modifications, and improvements which will readily occur to those skilled in the art. The described oscillator structure is of current-controlled type; voltage-controlled oscillators can of course be used. The monostable latch has been described as responding to all edges of the input signal; obviously, proper operation would be obtained with a monostable latch only responding to the rising (or falling) edges.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A phase-locked loop of the type including a locking aid circuit providing a d.c. presetting signal representative of a carrier frequency of an input signal to set a quiescent frequency of a controlled oscillator of the phase-locked loop, wherein the locking aid circuit includes a monostable latch clocked by the input signal to provide pulses of predetermined width, the presetting signal corresponding to the mean value of these pulses.

2. The phase-locked loop of claim 1, including means for setting an amplitude of the pulses proportionally to the presetting signal and for setting a width of the pulses in inverse proportion to the presetting signal.

3. The phase-locked loop of claim 2, including first and second current mirrors, a first output branch of the first mirror being coupled to an input branch of the second mirror by a switch controlled by an output signal of the monostable latch, an output branch of the second mirror being coupled to an input branch of the first mirror by a low-pass filter, and second and third output branches of the first mirror respectively providing the presetting signal of the controlled oscillator and a pulse width presetting signal to the monostable latch.

4. The phase-locked loop of claim 3, wherein the copying ratios of the first and third output branches of the first mirror are higher than that of the second output branch.

5. The phase-locked loop of claim 1, wherein the monostable latch has substantially the same structure as the controlled oscillator.

6. The phase-locked loop of claim 5, wherein the monostable latch includes:
   a capacitor coupled with charge and discharge current sources by respective switches;
   a hysteresis comparator receiving the voltage across the capacitor;
   a gate for controlling one of the respective switches when the input signal of the phase-locked loop and the output signal of the comparator are both in the high state;
   a gate for controlling the other one of the respective switches when the input signal of the phase-locked loop and the output signal of the comparator are both in the low state; and
   a gate for providing the output pulses of the monostable latch when the input signal of the phase-locked loop and the output signal of the comparator are both in a same state.

7. The phase-locked loop of claim 5, including four latches connected to generate, from the input signal of the phase-locked loop and the output signal of the comparator, four signals which are never all four at a same state when the frequency of the output signal of the comparator differs from that of the input signal of the phase-locked loop, and which all four take a same state when the frequency of the output signal of the comparator is equal to that of the input signal of the phase-locked loop, means being provided to force to an active state the output of the monostable latch when the state of one at least of the four signals differs from the others.

8. A phase-locked loop circuit comprising:
   a controlled oscillator;
   a locking aid circuit providing a d.c. presetting signal representative of a carrier frequency of an input signal that is adapted to set a quiescent frequency of the controlled oscillator;
   said locking aid circuit comprising a monostable latch clocked by the input signal to provide pulses of predetermined width;
   said presetting signal corresponding to the mean value of the pulses of predetermined width.

9. A phase-locked loop circuit according to claim 8 including a low pass filter for receiving the pulses of predetermined width to provide said presetting signal.

10. A phase-locked loop circuit according to claim 9 wherein said low pass filter comprises an R-C circuit.

11. A phase-locked loop circuit according to claim 8 including means for setting an amplitude of the pulses that is proportional to the presetting signal.

12. A phase-locked loop circuit according to claim 11 further including means for setting a width of the pulses in inverse proportion to the presetting signal.

13. A phase-locked loop circuit according to claim 12 wherein said means for setting comprises a pair of transistors.

14. A phase-locked loop circuit according to claim 13 including first and second current mirrors a first output branch of the first mirror being coupled to an input branch of the second mirror by a switch controlled by an output signal of the monostable latch.

15. A phase-locked loop circuit according to claim 14 further including an output branch of the second mirror that is coupled to an input branch of the first mirror by a low-pass filter.

16. A phase-locked loop circuit according to claim 15 further including second and third output branches of the first mirror, respectively, providing the presetting signal of the controlled oscillator and a pulse width presetting signal to the monostable latch.

17. A phase-locked loop circuit according to claim 16 wherein the copying ratios of the first and third output branches of the first mirror are higher than that of the second output branch.

18. A phase-locked loop circuit according to claim 8 wherein the monostable latch has substantially the same structure as the controlled oscillator.

19. A phase-locked loop circuit according to claim 8 wherein said monostable latch comprises a pair of switches and a capacitor coupled with charge and discharge current sources by the respective switches.

20. A phase-locked loop circuit according to claim 19 wherein said monostable latch further comprises a hysteresis comparator receiving the voltage across the capacitor.

21. A phase-locked loop circuit according to claim 20 wherein said monostable latch further includes a gate for controlling one of the respective switches when the input signal of the phase-locked loop and the output signal of the comparator are both in the high state.

22. A phase-locked loop circuit according to claim 21 wherein said monostable latch further comprises a gate for providing the output pulses of the monostable latch when the input signal of the phase-locked loop and the output signal of the comparator are both in the same state.

23. A phase-locked loop circuit according to claim 22 including four latches to generate, from the input signal of the phase-locked loop and the output signal of the comparator, four signals which are never all four at a same state when the frequency of the output signal of the comparator differs from that of the input signal of the phase-locked loop, in which all four take a same state when the frequency of the output signal of the comparator is equal to that of the input signal of the phase-locked loop.

24. A phase-locked loop circuit according to claim 23 further including means provided to force to an active state the output of the monostable latch when the state of one at least of the four signals differs from the others.

25. A phase-locked loop circuit comprising:
an input signal terminal;
a controlled oscillator;
a locking aid circuit providing a d.c. presetting signal representative of a carrier frequency of an input signal and that is adapted to set a quiescent frequency of the controlled oscillator;
said locking aid circuit comprising a monostable latch means clocked by the input signal to provide pulses of predetermined width; and
means for receiving the pulses of predetermined width to provide said presetting signal that in turn corresponds to the mean value of the pulses of predetermined width.

26. A phase-locked loop circuit according to claim 25 wherein said means for receiving pulses of predetermined width comprises a low pass filter means.

27. A phase-locked loop circuit according to claim 26 wherein said low pass filter means comprises an R-C circuit.

28. A phase-locked loop circuit according to claim 25 including means for setting an amplitude of the pulses that is proportional to the presetting signal.

29. A phase-locked loop circuit according to claim 28 further including means for setting a width of the pulses in inverse proportion to the presetting signal.

30. A phase-locked loop circuit according to claim 29 wherein said means for setting comprises a pair of transistors.

31. A monostable latch for a phase-locked loop circuit comprising:
an input signal terminal;
a pair of switches;
charge and discharge current sources;
a capacitor coupled with the charge and discharge current sources by respective switches;
a hysteresis comparator receiving the voltage across the capacitor;
a first gate for controlling one of the respective switches when the input signal of the phase-locked loop and the output signal of the comparator are both in a first same state;
a second gate for controlling the other one of the respective switches when the input signal of the phase-locked loop and the output signal of the comparator are both in a second same state; and
a third gate for providing the output pulses of the monostable latch when the input signal of the phase-locked loop and the output signal of the comparator are both in a same state.

32. A monostable latch according to claim 31 wherein said first gate is an AND gate.

33. A monostable latch according to claim 32 wherein said second gate comprises a NOR gate.

34. A monostable latch according to claim 33 wherein said third gate comprises an exclusive OR gate.

35. A monostable latch according to claim 34 wherein said current sources and said switches are coupled in series between opposite d.c. voltage levels.

36. A monostable latch according to claim 35 wherein the output of said comparator couples to inputs of both said first and second gates.

* * * * *